United States Patent [19]
Matthews et al.

[11] Patent Number: 5,367,166
[45] Date of Patent: Nov. 22, 1994

[54] INFRARED DETECTOR DEVICES AND THEIR MANUFACTURE

[75] Inventors: Brian E. Matthews; Michael D. Jenner, both of Hampshire, United Kingdom

[73] Assignee: Philips Electronics UK Limited, London, United Kingdom

[21] Appl. No.: 31,354

[22] Filed: Mar. 15, 1993

[30] Foreign Application Priority Data

Mar. 18, 1992 [GB] United Kingdom ............... 92059336

[51] Int. Cl.⁵ ............................................. H01L 27/14
[52] U.S. Cl. ............................ 250/338.1; 250/339.01
[58] Field of Search ................... 250/338.1, 338.4, 339; 257/465, 466

[56] References Cited

U.S. PATENT DOCUMENTS 4,972,244 11/1990 Buffet et al. ........................ 357/30

FOREIGN PATENT DOCUMENTS

| | | |
|---|---|---|
| 0007667 | 2/1980 | European Pat. Off. . |
| 0061803 | 10/1982 | European Pat. Off. . |
| 0475525 | 3/1992 | European Pat. Off. . |
| 0046765 | 2/1988 | Japan ................... 250/338.4 |
| 2207802 | 6/1989 | United Kingdom . |
| 2241605 | 1/1992 | United Kingdom . |

*Primary Examiner*—Paul M. Dzierzynski
*Assistant Examiner*—Richard Hanig
*Attorney, Agent, or Firm*—Lowe, Price, LeBlanc & Becker

[57] ABSTRACT

Compact electrical connections (4) are formed on sidewalls (1) of an infrared detector element having a step structure (1 to 3) over which a conductive layer (40) is deposited. Using a directional etching treatment, such as ion milling, the conductive layer (40) is removed from at least the bottom (3) of the step structure but is left lining the side-wall (1) as the connection (4). This permits formation of connections (4 and 44) in compact dense arrays, including plural-wavelength arrays in stacked bodies (10 and 20) on a circuit substrate (30).

15 Claims, 2 Drawing Sheets

INFRARED DETECTOR DEVICES AND THEIR MANUFACTURE

DESCRIPTION

This invention relates to infrared detector devices of, for example, cadmium mercury telluride or another infrared-sensitive material and further relates to methods of manufacturing such devices, particularly with regard to electrical connections extending on a side-wall of a step structure. The step structure (and its side-wall connection) may be formed between different regions within an infrared detector element, or it may for example be formed between a detector element and a substrate conductor pattern. The invention is particularly, but not exclusively, advantageous for the manufacture of plural-wavelength infrared detector arrays comprising two types of infrared detector elements which have different wavelength responses, for example one type in the 3 to 5 $\mu$m waveband and the other type in the 8 to 14 $\mu$m waveband.

It is known to manufacture infrared detector devices having an electrical connection extending on a side-wall of a step structure which is formed by a shaped body portion comprising infrared-sensitive material. Specific examples are described in for example, published European patent applications EP-A-0 007 667 (our reference PHB32631) and EP-A-0 061 803 (our reference PHB32767) and published United Kingdom patent applications GB-A-2 207 802 (our reference PHB32911) and GB-A-2 241 605 (our reference PHB33199). The whole contents of EP-A-0 007 667, EP-A-0 061 803, GB-A-2 241 605 and GB-A-2 207 802 are hereby incorporated herein as reference material. In the known methods the body portion is shaped (for example by etching) with a mask on top, after which conductive material is deposited to form a conductive layer extending on the top of the mask and bottom of the step structure and over the side-wall, and the mask is then removed to lift away the conductive material from the top while leaving the conductive layer lining the side-wall and the bottom of the step structure.

EP-A-0 061 803 discloses an advantageous infrared detector device structure and its manufacture, wherein the step structures are local apertures. The device comprises a substrate (for example, a silicon integrated circuit) having a conductor pattern at a major surface. An array of infrared detector elements is formed in a body of infrared-sensitive material (for example, cadmium mercury telluride) provided on said major surface of the substrate. Each detector element comprises an aperture which extends through the body to the conductor pattern of the substrate and which is lined at its side wall with a conductive layer forming an electrical connection between the detector element and a first part of the conductor pattern.

The side-wall lined aperture in the device structure of EP-A-0 061 803 provides a compact and convenient means for forming electrical connections to the substrate conductor pattern. This structure is particularly advantageous for an array of detector elements. EP-A-0 061 803 discloses the formation of an array of photodiodes at the connection apertures in the body, each photodiode comprising a p-n junction around a respective aperture of the array.

More information about an object or a scene can be obtained by viewing it at different wavelengths using at least two different types of detector elements. These detector elements may be formed conveniently in different bandgap infrared-sensitive semiconductor materials provided one on top of the other on the substrate. Preferably, the side-wall lined aperture structure of EP-A-0 061 803 is retained. European patent application EP-A-0 475 525 corresponding to U.S. Pat. No. 5,185,648 discloses such an arrangement. The whole contents of (U.S. Pat. No. 5,185,648) are hereby incorporated herein as reference material. The specific arrangements disclosed in EP-A-0 475 525 are particularly suitable for forming arrays of detector elements in which, when viewed in plan view, the detector elements of one type are located between the elements of the other type.

It is an aim of the present invention to provide alternative methods and arrangements for forming side-wall electrical connections for infrared detector elements, particularly but not exclusively to conductor patterns of a substrate, and particularly but not exclusively an alternative arrangement suitable for dense compact arrays having different types of detector element which may be coincident with each other in plan view.

According to one aspect of the present invention there is provided a method of manufacturing an infrared detector device having an electrical connection extending on a side-wall of a step structure which is formed by a shaped body portion comprising infrared-sensitive material, which method includes the process steps of:

(a) depositing conductive material to form a conductive layer extending on at least the bottom of the step structure and over the side-wall, and (b) effecting a directional etching treatment to remove the conductive layer from the bottom while leaving the conductive layer lining the side-wall so as to provide the electrical connection extending between the top and bottom of the step structure.

Such a method may be used to manufacture a device comprising arrays of different types of detector element in upper and lower bodies of infrared-sensitive material on the substrate. Side-wall lined apertures may be retained in at least the lower body of such a plural-wavelength infrared detector array device, and the detector elements of one type may overlap in plan view the detector elements of the other type. However, methods in accordance with the invention may be utilized for the manufacture of other infrared detector device structures with side-wall electrical connections, for example with connections at the side-walls of mesas of infrared-sensitive material and/or in a single level of infrared-sensitive material of the same wavelength characteristics.

One particular method in accordance with the invention comprises the steps of:

(i) providing at least one body portion comprising infrared-sensitive material on a conductor pattern of a substrate, the body portion(s) having at least two side-walls which extend to first and second separate parts of the conductor pattern, (ii) depositing conductive material to form a conductive layer on the two side-walls, which layer also extends on a part of the substrate between these side-walls, and (iii) effecting a directional etching treatment to remove the conductive layer from the substrate while leaving the conductive layer lining the two side-walls so as to provide separate first and second electrical connections on these side-walls to the respective first and second parts of the conductor pattern of the substrate.

According to another aspect of the present invention there is provided an infrared detector device comprising a substrate having a conductor pattern at a major surface, and at least one infrared detector element formed in a body of infrared-sensitive material provided on said major surface of the substrate, the detector element comprising an aperture which extends through the body to the conductor pattern of the substrate and which is lined at its side-wall with a conductive layer forming an electrical connection between the detector element and a first part of the conductor pattern, which device is characterised in that the aperture surrounds a pillar portion of the body, and a conductive layer on the pillar portion forms an electrical connection which extends to a second part of the conductor pattern of the substrate.

Such an arrangement is particularly advantageous for detector devices comprising infrared detector elements of at least first and second types which have different wavelength responses, the first type being formed in the first body of infrared-sensitive material which is provided on said major surface of the substrate, the second type being formed in a second body of infrared-sensitive material which is provided on the first body; the conductive layer on the pillar portion of the first body may form part of an electrical connection between the second type of detector element and the second part of the conductor pattern of the substrate.

According to a further aspect of the present invention there is provided an infrared detector device comprising a substrate having a conductor pattern at a major surface, and comprising infrared detector elements of at least first and second types which have different wavelength responses, the first type being formed in a first body of infrared-sensitive material which is provided on said major surface of the substrate, the second type being formed in a second body of infrared-sensitive material which is provided on the first body, wherein the or each detector element of the first type comprises a first aperture which extends through the first body to the conductor pattern of the substrate and which is lined at its side-wall with a first conductive layer forming an electrical connection between the detector element of the first type and a first part of the conductor pattern, and wherein the or each detector element of the second type comprises an electrical connection which extends to a second part of the conductor pattern of the substrate and which comprises a second conductive layer in a second aperture which extends through insulating material present in the first aperture, the first and second conductive layers being separated by the insulating material.

According to yet another aspect of the present invention there is provided an infrared detector device comprising at least one infrared detector element formed around an aperture in a body of infrared-sensitive material and having an electrode layer on an insulating layer around the top of the aperture, a region of one conductivity type present in the body and adjoining the side-wall(s) and bottom of the aperture, a conductive layer lining the side-wall(s) to form an electrical connection between the region and the electrode layer, and the region at the bottom of the aperture providing an infrared-sensitive area of the detector.

These and other features in accordance with the invention are illustrated specifically in embodiments of the invention now to be described, by way of example, with reference to the accompanying diagrammatic drawings, in which.

Figure 1:
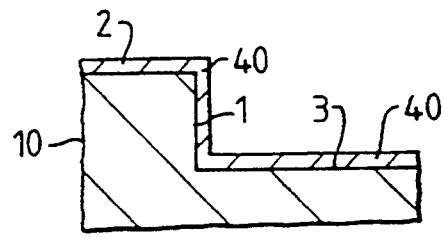
FIGS. 1 and 2 are cross-sectional side-views of a step structure of an infrared detector device at two successive stages in its manufacture by a method in accordance with the present invention.

It should be noted that all the Figures are diagrammatic and not drawn to scale. The relative dimensions and proportions of parts of these drawings have been shown exaggerated or diminished for the sake of clarity and convenience in the drawings. The same reference signs as used in one embodiment are generally used when referring to corresponding or similar parts in other embodiments.

Figure 2:
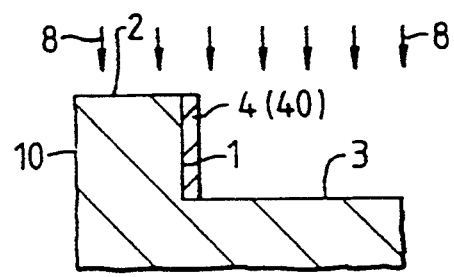

The infrared detector device being manufactured in FIGS. 1 and 2 comprises a step structure which has a side-wall 1, a top 2 and a bottom 3 and which is formed by a shaped body portion 10 comprising infrared-sensitive material, for example cadmium mercury telluride. Depending on the particular device, the infrared-sensitive material may be adjacent to the side-wall 1 and/or the top 2 and/or the bottom 3 of the step structure. The device has an electrical connection 4 extending on the side-wall 1. Depending on the particular device, the connection 4 may make an electrical contact to a conductive portion of the step structure at the side-wall 1 and/or the top 2 and/or the bottom 3. In a particularly advantageous form, the connection 4 may electrically contact the infrared-sensitive material at the side-wall 1 and also an electrode layer or conductor pattern at either the top 2 or bottom 3 of the step structure. However, in some devices the connection 4 is insulated from infrared-sensitive material at the side-wall 1 by an insulating layer lining this side-wall, and the connection 4 in this case may form an interconnect between conductive layers at the top 2 and bottom 3 of the step structure.

FIG. 1 shows the step structure after the deposition of conductive material to form a conductive layer 40 extending on the top 2 and bottom 3 of the step structure and over the side-wall 1. The conductive material may be a doped semiconductor, but it is more usually a metal, for example gold on chrome.

The structure is then subjected to a directional etching treatment, for example ion-milling with a beam of ions 8 as illustrated in FIG. 2 so as to remove the conductive layer 40 from the top 2 and bottom 3 of the step structure. However, this directional etching treatment leaves the conductive layer 40 lining the side-wall 1 so as to provide the electrical connection 4 extending between the top 2 and bottom 3 of the step structure.

Figure 6:
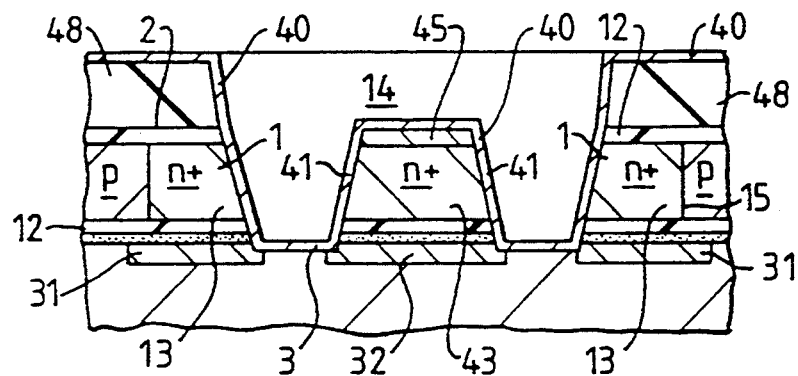
FIG. 6 is a cross-sectional side-view of the lower body part of the array of FIG. 5 at the FIG. 1 stage of its manufacture.

Usually the step structure is formed by etching away a part of the body portion 10 using a mask pattern on the top 2. This mask pattern was removed in the FIG. 1 arrangement before depositing the conductive layer 40. However, it is also possible to deposit the layer 40 before removing the mask pattern (an example of which is shown in FIG. 6), and then to use lift-off of the mask pattern to remove the overlying conductive layer 40 from the top of the step structure before the FIG. 2 stage. In this case the layer 40 is present on only the side-wall 1 and bottom 3 when subjected to the directional etching treatment of FIG. 2, and this directional treatment removes the layer 40 from the bottom 3.

It is also possible to pre-shape a body of a detector element and then to mount it on a substrate to form the step structure for FIG. 1. The substrate provides the bottom 3, and the mounted body provides the top 2 and side-wall(s) 1. This provides an alternative to forming detector-element bodies in situ on a substrate by the more usual process of etching through a wafer or layer of infrared-sensitive material mounted on the substrate. A variety of geometries for the step structure 1 to 3 are also possible, for example at a periphery of a body or a local aperture in the body.

Thus, it will be evident that the step structure 1 to 3 and side-wall connection 4 of FIGS. 1 and 2 may take a variety of specific forms, depending on the particular infrared detector device being manufactured and its particular manufacturing process.

Figure 3:
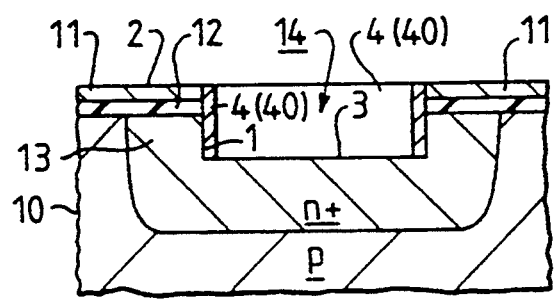
FIG. 3 is a cross-sectional side view of an infrared detector element having such a step structure and manufactured using the stages of FIGS. 1 and 2.

FIG. 3 illustrates one specific embodiment in which the step structure 1 to 3 is formed by a local aperture 14. An infrared detector element is formed around the aperture 14 in a body 10 of infrared-sensitive cadmium mercury telluride. The step structure comprises an electrode layer 11 (for example of gold or chromium) on an insulating layer 12 (for example of zinc sulphide or cadmium telluride) on the cadmium mercury telluride, around the top of the aperture 14. The aperture 14 may be formed by locally etching through the electrode and insulating layers and into underlying region of the body 10. Ion milling may be used to form the aperture 14, in which case p type cadmium mercury telluride can be converted by the milling step into an n type region 13 adjacent to the side-wall 1 and bottom 3 of the aperture 14. In this case, the conductive layer 4 left in the FIG. 2 process step may form an electrical connection from a side-wall part of the region 13 to a side-wall part of the electrode layer 11. The conductive layer 40 is removed from the bottom 3 of the aperture 14 in the FIG. 2 process step so that the region 13 at the bottom 3 of the aperture 14 provides an infrared-sensitive part of the detector element.

Figure 4:
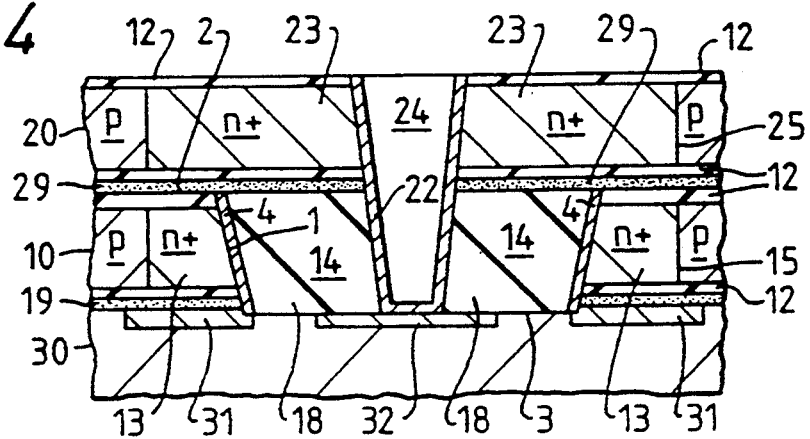
FIG. 4 is a cross-sectional side view of part of a plural-wavelength infrared detector array on a circuit substrate and which is manufactured using the stages of FIGS. 1 and 2.

FIG. 4 illustrates another specific embodiment in which the shaped body portion 10 forming the step structure 1 to 3 is present on a substrate 30, for example a silicon integrated circuit 30 with a conductor pattern 31, 32. The two separate parts 31 and 32 of the conductor pattern may be contact pads of the integrated circuit. There are separate contact pads for each detector element of the device array. The body portion 10 may be secured on the substrate 30 by an intermediate epoxy adhesive layer 19. The side-wall 1 is formed by etching an aperture 14 through the thickness of the body portion 10 to the conductor pattern 31, 32 of the substrate 30. An array of apertures 14 is formed so as to form an array of detector elements in this lower body 10 on the substrate 30. Each detector element comprises a p-n junction 15 found by an annular n type region 13 which extends around the side-wall 1 of the aperture 14. The region 13 may be formed during the ion-milling of the aperture 14 by conductivity-type conversion as described in EP-A-0 061 803.

The side-wall 1 of the aperture 14 in FIG. 4 extends to a first annular part 31 of the conductor pattern 31, 32 of the substrate 30. The separate second part 32 of the conductor pattern 31, 32 is spaced sufficiently from the side-wall 1 that the conductive layer 40 left in the FIG. 2 process step forms an electrical connection 4 to the first part 31 without contacting the second part 32 of the conductor pattern of the substrate 30.

After carrying out the directional etching process step of FIG. 2 in the embodiment of FIG. 4, the apertures 14 are filled with insulating material 18 (for example cadmium telluride or a glass) to cover the connection 4. A second aperture 24 is then etched through the insulating material 18 to the second part 32 of the conductor pattern 31, 32 and a further conductive layer 22 is then deposited in the second aperture 24 to form a further electrical connection which contacts the conductor part 32 and is separated from the first connection 4 by the insulating material 18.

The device of FIG. 4 is a plural-wavelength infrared detector array which includes a second body portion 20 comprising infrared-sensitive material (for example cadmium mercury telluride of a different bandgap) having a different wavelength response from that of the first body portion 10. This second body portion 20 is mounted on the first body portion 10 after filling the apertures 14 but before etching the second apertures 24. The second apertures 24 are then etched through both the second body portion 20 and the insulating filler material 18, whereby the further conductive layer 22 forms an electrical connection from a side-wall part 23 of the second body portion to the second conductor part 32 of the substrate 30. In this manner dense compact arrays of the different detector element types in the body portions 10 and 20 can be formed so as to be coincident with each other in plan view and each having side-wall connections 4 and 22 to an underlying silicon integrated circuit substrate. The different detector elements are each photodiodes having p-n junctions 15 and 25 respectively which can be formed by ion-milling the apertures 14 and 24 in the respective cadmium mercury telluride body portions 10 and 20. Both body portions 10 and 20 have passivating insulation layers 12 on their top and bottom surfaces, and the two body portions 10 and 20 may be bonded together by an intermediate epoxy adhesive film 29.

Figure 5:
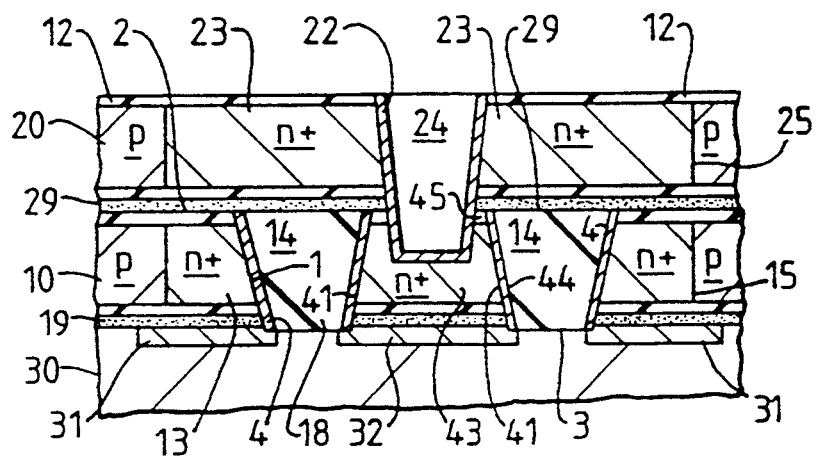
FIG. 5 is a cross-sectional side view of part of a variant plural-wavelength infrared detector array which is also manufactured using the stages of FIGS. 1 and 2.

In the FIG. 4 embodiment the directional etching treatment of the FIG. 2 process step is used to expose the substrate conductor part 32 while forming the connection 4 to the separate conductor part 31. FIGS. 5 and 6 illustrate a modification in which the directional etching treatment of the FIG. 2 process step is used to form separate connections 4 and 44 to the respective conductor parts 31 and 32 of the substrate 30, while clearing the excess conductive layer 40 from the bottom of the aperture 14 thereby isolating the two connections 4 and 44 from each other.

The manufacturing method employed in the embodiment of FIGS. 5 and 6 comprises the steps of:

(i) providing at least one body portion 10 comprising infrared-sensitive material on a conductor pattern 31, 32 etc. of a substrate 30, the body portion 10 having at least two side-walls 1 and 41 which extend to first and second separate parts 31 and 32 of the conductor pattern, (ii) depositing conductive material 40 to form a conductive layer on the two side-walls 1 and 41, which layer 40 also extends on a part of the substrate 30 between these side-walls, and (iii) effecting a directional etching treatment (as in FIG. 2) to remove the conductive layer 40 from the substrate 30 while leaving the conductive layer 40 lining the two side-walls 1 and 41 so as to provide separate first and second electrical connections 4 and 44 on these side-walls 1 and 41 to the respective first and second parts 31 and 32 of the conductor pattern of the substrate 30.

Step (i) comprises locally etching through a body 10 comprising the infrared-sensitive material (for example cadmium mercury telluride) so as to form on the substrate 30 a pillar portion 43 of the body surrounded by an aperture 14 which extends locally through the body. The outer walls of the pillar portion 43 and of the aperture 14 form the two side-walls 41 and 1 which extend to the different parts 32 and 31 of the conductor pattern. There is a further conductive layer 45 (for example of gold) on the top of the pillar portion 43, and this further conductive layer 45 may be used as a mask to define the lateral extent of the pillar portion 43 when etching the aperture 14. The main body portion 10 may be masked with photoresist 48 when forming the aperture 14. Using this mask pattern 45 and 48, the apertures 14 may be defined using an ion etching treatment which also converts the adjacent areas of p type cadmium mercury telluride to form the n type photodiode region 13 and the n type conductivity of the pillar portion 43.

FIG. 6 illustrates the next stage in which the conductive layer 40 is deposited on the structure with its two side-walls 1 and 41. The photoresist pattern 48 is then removed to lift off the areas of the layer 40 thereon and to leave the conductive layer 40 on the side-walls 1 and 41 and on the bottom 3 of the aperture 14.

The directional etching treatment of FIG. 2 is then carried out, for example by ion milling, to remove the conductive layer 40 from the bottom 3 of the aperture 14. The remaining parts of the layer 40 form the connections 4 and 44. The connection 44 contacts the side of the further conductive layer 45 at the top of the pillar portion 43, contacts the side-wall of the pillar portion 43 and contacts the substrate-conductor part 32 at the bottom.

After this directional etching treatment (step (iii) above), there is mounted on the first body 10 a second body 20 of infrared sensitive material (See FIG. 5) for providing a second type of infrared detector element having a different wavelength response. The apertures 14 may be filled with an insulating material 18 before providing the body 20, and the two body portions 10 and 20 may be bonded together by an epoxy adhesive film 29 as in FIG. 4. An aperture 24 is etched locally through the second body 20 and is lined with a deposited conductive layer 22 to form an electrical connection from the second type of detector element to the conductive layers 44 and 45 on the pillar portion 43.

Figure 7:
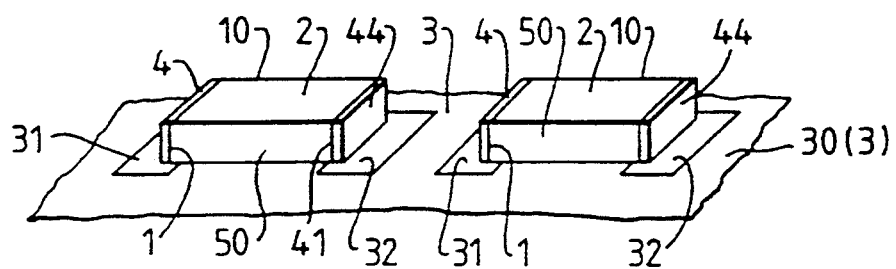
FIG. 7 is an isometric view of part of a further infrared detector device comprising detector elements on a circuit substrate and manufactured using the stages of FIGS. 1 and 2.

It will be evident that methods in accordance with the present invention may be used in the manufacture of other device structures having electrical connections extending on side-walls. FIG. 7 illustrates one such other structure comprising a plurality of infrared detector elements each having its own individual body 10 of infrared-sensitive material present on a substrate 30 having a conductor pattern with separate parts 31 and 32. The detector elements may be photoconductors similar to those of EP-A-0 007 667 or photodiodes similar to those of GB-A-2 241 605. Each detector element has two electrodes 4 and 44 on side-walls 1 and 41 at opposite ends of its individual body 10. These electrodes 4 and 44 form respective connections to the separate parts 31 and 32 of the substrate conductor pattern and are formed from a single conductive layer 40 by a directional etching treatment, in accordance with the process stages illustrates in FIGS. 1 and 2. The longitudinal side-walls 50 of the detector elements can be formed by etching the bodies 10 in a separate treatment with photolithographic masking.

The present invention is particularly useful for dense compact arrays of infrared detector elements, because the amount of "dead-space" (non infrared-sensitive area) needed for electrical connections of the detector elements can be kept very small. This results from using the directional etching treatment of FIG. 2 to isolate individual connections 4 (and 44 when present) by removing the layer 40 from the bottom 3 of the step structure, while leaving the layer 40 lining its side-wall 1 (and 41 when present). In a particular example of the FIG. 4 array, the apertures 14 may have of a width of 8 micrometers and the apertures 24 may have a width of 4 micrometers. However it will be evident that the process stages of FIGS. 1 and 2 may be applied to other electronic devices (and not merely infrared detectors) so as to form electrical connections which line the side-wall of a step-structure of the device, for example a semiconductor thin-film circuit or a monolithic semiconductor integrated circuit or another type of semiconductor device.

Thus, many other variations and modifications are possible. Such variations and modifications apparent to persons skilled in the art may involve equivalents and other features which are already known in the design, manufacture and use of infrared detectors and other electronic devices and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing an infrared detector device having an electrical connection extending on a side-wall of a step structure which is formed by a shaped body portion comprising infrared-sensitive material, which method includes the process steps of:

(a) depositing conductive material to form a conductive layer extending on at least the bottom of the step structure and over the side-wall, and (b) effecting a directional etching treatment to remove the conductive layer from the bottom while leaving the conductive layer lining the side-wall so as to provide the electrical connection extending between the top and bottom of the step structure.

2. A method as claimed in claim 1, wherein the step structure comprises an electrode layer on an insulating layer on a body of the infrared-sensitive material, and the step structure is formed by locally etching an aperture through the electrode and insulating layers and into an underlying region of the body, and wherein the conductive layer left in process step (b) forms an electrical connection from a side-wall part of the region to a side-wall part of the electrode layer, the region at the bottom of the aperture providing an infrared-sensitive area of the detector device.

3. A method as claimed in claim 1, wherein the shaped body portion forming the step structure is present on a conductor pattern of a substrate and the side-wall extends to a first part of the conductor pattern, a separate second part of the conductor pattern being present at the bottom of the step structure and being spaced sufficiently from the side-wall that the conductive layer left in process step (b) forms an electrical connection to the first part without contacting the second part of the conductor pattern.

4. A method as claimed in claim 3, wherein the step structure is formed by etching a first aperture through the thickness of the body portion to the conductor pattern of the substrate, and after the process step (b) the following process steps are carried out: (c) filling the first aperture with insulating material to cover the electrical connection, (d) etching a second aperture through the insulating material to the second part of the conductor pattern, and (e) depositing a further conductive layer in the second aperture to form a further electrical connection which contacts the second part of the conductor pattern.

5. A method as claimed in claim 4, wherein between the process steps (c) and (d) a second body portion comprising infrared-sensitive material is mounted on the first body portion, and the second aperture is etched through both the second body portion and the insulating material whereby the further conductive layer forms an electrical connection from a side-wall part of the second body portion to the second part of the conductor pattern of the substrate.

6. A method according to claim 1 wherein ion milling is used to perform the directional etching treatment.

7. A method of manufacturing an infrared detector device comprising the steps of:
 (i) providing at least one body portion comprising infrared-sensitive material on a conductor pattern of a substrate, said at least one body having at least two side-walls which extend to first and second separate parts of the conductor pattern,
 (ii) depositing conductive material to form a conductive layer on the two side-walls, which layer also extends on a part of the substrate between these side-walls, and
 (iii) effecting a directional etching treatment to remove the conductive layer from the substrate while leaving the conductive layer lining the two side-walls so as to provide separate first and second electrical connections on these side-walls to the respective first and second parts of the conductor pattern of the substrate.

8. A method as claimed in claim 7, wherein step (i) comprises locally etching through a body comprising the infrared-sensitive material so as to form on the substrate a pillar portion of the body surrounded by an aperture which extends locally through the body, the outer walls of the pillar portion and the aperture forming the two side-walls which extend to the first and second parts of the conductor pattern.

9. A method as claimed in claim 8, wherein after effecting step (iii) there is mounted on the first body a second body of infrared-sensitive material for providing a second type of infrared detector element having a different wavelength response from a detector element formed in the first body, and an electrical connection is formed from the second type of detector element to the conductive layer on the pillar portion.

10. A method as claimed in claim 9, wherein the conductive layer on the side-wall of the pillar portion contacts the side of a further conductive layer on top of the pillar portion, and an aperture is etched locally through the second body and is lined with a deposited conductive layer to form the electrical connection from the second type of detector element to at least the further conductive layer on the pillar portion.

11. A method as claimed in claim 7, wherein ion milling is used to perform the directional etching treatment.

12. An infrared detector device comprising at least one infrared detector element formed around an aperture in a body of infrared-sensitive material and having an electrode layer on an insulating layer around the top of the aperture, a region of one conductivity type present in the body and adjoining the sidewalls and bottom of the aperture, a conductive layer lining the sidewalls thereof to form an electrical connection between the region and the electrode layer, and the region at the bottom of the aperture providing an infra-red sensitive area of the detector.

13. An infrared detector device comprising a substrate having a conductor pattern at a surface thereof, the detector element comprising an aperture which extends through the body to the conductor pattern of the substrate and which is lined at its side-wall with a conductive layer forming an electrical connection between the detector element and a first part of the conductor pattern, characterised in that the aperture surrounds a pillar portion of the body, and a conductive layer on the pillar portion forms an electrical connector which extends to a second part of the conductor pattern of the substrate.

14. An infrared detector device as claimed in claim 13, further characterised by comprising infrared detector elements of at least first and second types which have different wavelength responses, the first type being formed in the first body of infrared-sensitive material which is provided on said surface of the substrate, the second type being formed in a second body of infra-red-sensitive material which is provided on the first body, wherein the conductive layer on the pillar portion of the first body forms part of an electrical connection between the second type of detector element and the second part of the conductor pattern of the substrate.

15. An infrared detector device comprising a substrate having a conductor pattern at a surface, and comprising infrared detector elements of at least one first and one second type which have different wavelength responses, the first type being formed in a first body of infra-red sensitive material which is provided on said surface of the substrate, the second type being formed in a second body of infrared-sensitive material which is provided on the first body, wherein said at least one detector element of the first type comprises a first aperture which extends through the first body to the conductor pattern of the substrate and which is lined at its side-wall with a first conductor layer forming an electrical connection between the detector element of the first type and a first part of the conductor pattern, and wherein said at least one detector element of the second type comprises an electrical connection which extends to a second part of the conductor pattern of the substrate and which comprises a second conductive layer in a second aperture which extends through insulating material present in the first aperture, the first and second conductive layers being separated by the insulating material.

* * * * *